United States Patent
Izawa et al.

(10) Patent No.: US 7,641,382 B2
(45) Date of Patent: Jan. 5, 2010

(54) LEAK JUDGMENT METHOD, AND COMPUTER-READABLE RECORDING MEDIUM WITH RECORDED LEAK-JUDGMENT-EXECUTABLE PROGRAM

(75) Inventors: Hiroshi Izawa, Kyotanabe (JP); Hiroshi Echizen, Nara (JP); Hirokazu Ohtoshi, Nara (JP); Masatoshi Tanaka, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 366 days.

(21) Appl. No.: 11/270,563

(22) Filed: Nov. 10, 2005

(65) Prior Publication Data

US 2006/0068081 A1 Mar. 30, 2006

Related U.S. Application Data

(62) Division of application No. 09/837,459, filed on Apr. 19, 2001, now abandoned.

(30) Foreign Application Priority Data

Apr. 28, 2000 (JP) .............................. 2000-131772

(51) Int. Cl.
*G01N 25/72* (2006.01)
*G01K 13/02* (2006.01)
*G01K 1/00* (2006.01)
*G01M 3/02* (2006.01)

(52) U.S. Cl. ............................... 374/4; 374/45; 374/29; 374/141; 374/147; 374/135; 73/40; 432/200

(58) Field of Classification Search ................... 374/29, 374/4, 5, 43, 44, 45, 57, 120–21, 141, 143, 374/147, 137, 110–112, 148, 30, 135; 118/715, 118/728, 50, 663, 61, 666, 667, 719; 156/345.29, 156/345.33, 345.34; 73/40, 40.5 R, 45.3, 73/45.4; 62/129; 432/200; 436/3; 427/8

See application file for complete search history.

(56) References Cited

U.S. PATENT DOCUMENTS 3,771,313 A * 11/1973 Kaiho ......................... 60/216

(Continued)

FOREIGN PATENT DOCUMENTS

JP 08105812 A * 4/1996

(Continued)

*Primary Examiner*—Gail Verbitsky
(74) *Attorney, Agent, or Firm*—Fitzpatrick, Cella, Harper & Scinto

(57) ABSTRACT

In a deposited-film formation apparatus or process having the means or steps of evacuating the inside of an inside-evacuatable chamber through an evacuation piping by an evacuation means, feeding a material gas into the chamber while evacuating the inside of the chamber, and applying a high-frequency power to form a deposited film on a substrate disposed inside the chamber, a leak is detected on the basis of a measured value of a temperature sensor which detects the heat of reaction that is generated when the material gas fed into the chamber reacts with oxygen contained in air having entered from the outside, so as to be able to stop the material gas feeding.

In deposited-film formation apparatus or processes making use of spontaneously ignitable gases, the leak can quickly be detected when air enters the chamber because of any unexpected accident such as a break of piping.

5 Claims, 7 Drawing Sheets

U.S. PATENT DOCUMENTS

| | | | | |
|---|---|---|---|---|
| 4,356,825 A * | 11/1982 | Veth | | 600/301 |
| 4,357,113 A * | 11/1982 | Brooks | | 374/4 |
| 4,409,817 A * | 10/1983 | Edwards, Jr. | | 73/40.7 |
| 4,602,872 A * | 7/1986 | Emery et al. | | 374/152 |
| 4,862,731 A * | 9/1989 | Gates | | 73/40.7 |
| 4,969,749 A * | 11/1990 | Hasselmann | | 374/115 |
| 5,093,571 A | 3/1992 | Inomata et al. | | 250/288 |
| 5,127,365 A * | 7/1992 | Koyama et al. | | 118/724 |
| 5,522,957 A | 6/1996 | Weling et al. | | 156/626.1 |
| 5,632,820 A * | 5/1997 | Taniyama et al. | | 118/724 |
| 6,113,732 A | 9/2000 | Yoshida et al. | | 156/345 |
| 6,155,289 A * | 12/2000 | Carlsen et al. | | 137/457 |
| 6,217,211 B1 * | 4/2001 | Hesky | | 374/4 |
| 6,238,488 B1 | 5/2001 | Fujita et al. | | 134/18 |
| 6,273,955 B1 | 8/2001 | Yoshino et al. | | 118/723 |
| 6,286,992 B1 * | 9/2001 | Kyrtsos | | 374/45 |
| 6,349,589 B1 * | 2/2002 | Zhou | | 73/40 |
| 6,354,140 B1 * | 3/2002 | Farkas et al. | | 73/40.5 R |
| 6,440,504 B1 * | 8/2002 | Akiyama | | 427/569 |
| 6,485,297 B2 * | 11/2002 | Nakamura | | 432/242 |
| 6,576,061 B1 | 6/2003 | Moriyama et al. | | 156/345.31 |
| 6,660,094 B2 * | 12/2003 | Otoshi et al. | | 118/718 |
| 6,880,382 B2 * | 4/2005 | Liu et al. | | 73/40.7 |
| 7,001,640 B2 * | 2/2006 | Otoshi et al. | | 427/248.1 |
| 7,194,893 B2 * | 3/2007 | Cook et al. | | 73/40.5 R |
| 2003/0037730 A1 * | 2/2003 | Yamasaki et al. | | 118/715 |
| 2003/0207021 A1 * | 11/2003 | Izawa et al. | | 427/8 |
| 2005/0037500 A1 * | 2/2005 | Ciovacco et al. | | 436/3 |
| 2005/0086952 A1 * | 4/2005 | Nonaka et al. | | 62/129 |
| 2008/0160361 A1 * | 7/2008 | Ohara et al. | | 429/17 |
| 2009/0229348 A1 * | 9/2009 | Woo | | 73/40.5 R |

FOREIGN PATENT DOCUMENTS

JP    11-121598    4/1999

* cited by examiner

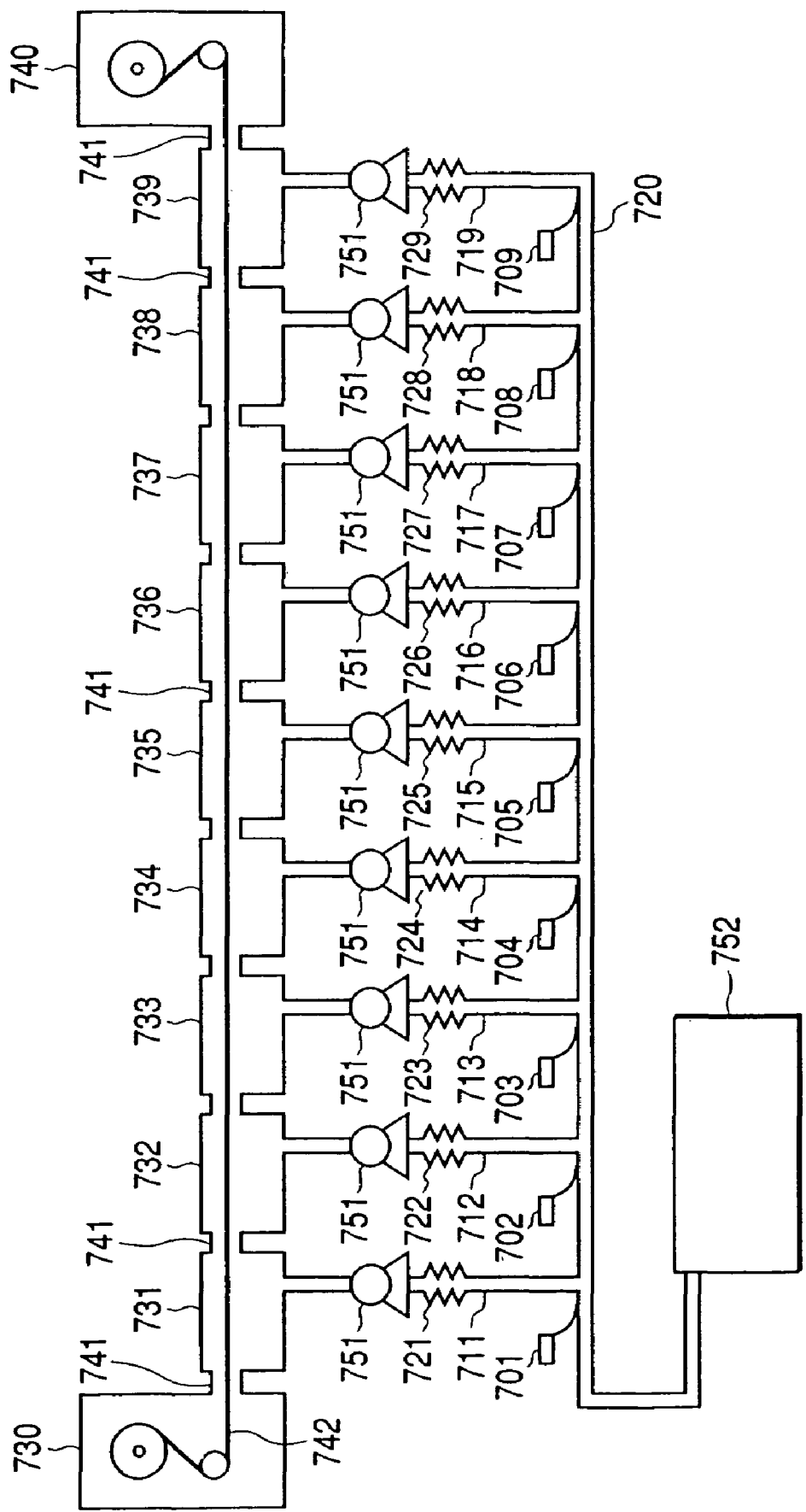

LEAK JUDGMENT METHOD, AND COMPUTER-READABLE RECORDING MEDIUM WITH RECORDED LEAK-JUDGMENT-EXECUTABLE PROGRAM

CROSS-REFERENCE TO RELATED APPLICATIONS

This is a division of application Ser. No. 09/837,459, filed Apr. 19, 2001.

BACKGROUND OF THE INVENTION

1. Field of the Invention

This invention relates to a deposited-film formation apparatus, a deposited-film formation process, a vacuum system, a leak judgment method, and a computer-readable recording medium with a recorded program. More particularly, this invention relates to a deposited-film formation apparatus, a deposited-film formation process, a vacuum system, a leak judgment method, and a computer-readable recording medium with a recorded leak-judgment-executable program (a recording medium any information recorded in which is readable by a computer and in which a program capable of executing the judgment of a leak of air has been recorded) which apparatus, process, system, method and medium can perform detection of any inclusion of air from the outside.

2. Related Background Art

Various proposals are conventionally made on processes for making functional deposited films for solar cells such as amorphous silicon solar cells and electrophotographic photosensitive members. Such deposited films are commonly formed by means of a vacuum system, which decomposes material gases to form deposited films. In this vacuum system, entrance (or inclusion) (hereinafter often "leak") of air from the outside must be prevented for the reasons as stated below.

One of the reasons is that the material gases which may spontaneously ignite upon self-decomposition with air are used as material gases used to form the deposited films. Hence, any air entering the vacuum system from the outside due to leak causes undesired decomposition inside a vacuum chamber of the vacuum system. The undesired decomposition is caused by self-decomposition with air. Therefore, the self-decomposition may preferably be suppressed during deposited film formation.

Incidentally, air having entered in a large quantity due to leak may cause explosion dangerously.

Another reason is that even slight leak of air (in particular, oxygen) in deposited films makes the resultant functional deposited films have greatly poor electrical properties. Hence, systems or apparatus for forming the deposited films must be provided with chambers and piping which are highly vacuum enough for the air not to enter from the outside. Also, the systems must periodically be checked so that the air do not enter from the outside.

As methods for detecting any leak to examine whether or not air has entered (leaked) the vacuum chamber or piping from the outside, the following methods are commonly used. Methods for detecting leaks are roughly grouped into a "pressure method" in which the structure to be examined is brought into a pressed condition and a "vacuum method" in which the structure to be examined is brought into a vacuum condition.

The pressure method includes a "pressure and leaving method" in which the inside of the structure to be examined is pressurized and any change in pressure after a certain time is measured with a pressure gauge, a "pressure and foaming method" in which the structure to be examined is coated with a foamable solution and any foams formed thereat are visually observed, and a "halogen leak test method" in which the structure to be examined is pressurized with a halogen gas and thereafter any gas leaking outside is detected with a halogen leak detector.

The vacuum method includes a "vacuum and leaving method" in which the inside of the structure to be examined is evacuated and any change in pressure after a certain time is measured with a vacuum gauge, a "Geissler tube method" in which after evacuation any change in color of discharge ascribable to a probe gas is visually observed, and a "helium leak test method" in which after evacuation the structure to be examined is sprayed with helium gas from the outside and any gas leaking inside is detected with a helium leak detector.

It is common to form deposited films in a state where air has been kept not entering the vacuum system while managing any of these methods. It is considered possible to form deposited films in a state free of any leak while judging the leak of air by such methods.

However, in such leak detection methods, the following problems may arise in the case of apparatus which make use of material gases in a large quantity and also are continuously operated for the purpose of mass production-of deposited films as in the case of an apparatus for forming solar cells comprised of amorphous silicon which are intended for electric power generation.

In the above leak detection methods, the apparatus must be tested in a condition different from a condition where the deposited films are being formed, e.g., the apparatus is made airtight and certain specific gases are flowed. For example, at the time of maintenance, a service person must make sure of any leak. However, even when good results are obtained on the check of leaks at a certain point of time, a leak may occur because of, e.g., looseness of flanges at a point of time where deposited films are again begun to be formed. A leak may also suddenly occur because of an earthquake or the like. Accordingly, under such situations, it is impossible to detect the leak when it occurs in the midst of formation of deposited films.

As another problem, when a deposited-film formation apparatus has a large scale, when it takes a long time to form deposited films or when material gases are used in a large quantity, the formation of deposited films may inevitably be continued as the air is kept included inside the apparatus, so that deposited films having a low quality may be produced in a large quantity. Also, the material gases used in a large quantity are spontaneously ignitable gases and, in some cases, some have a high toxicity. Hence, if the formation of deposited films is continued as the leak is left unrepaired, there is a danger of causing a fire or explosion as a result of the reaction of material gases with the air, or being exposed to gas leakage to become injured.

Under such circumstances, it is sought to make an improvement in order to form functional deposited films in a large quantity, safely and stably.

SUMMARY OF THE INVENTION

Taking account of such a subject, an object of the present invention is to provide a deposited-film formation apparatus, a deposited-film formation process, a vacuum system, a leak judgment method, and a computer-readable recording medium with a recorded leak-judgment-executable program which apparatus, process, system, method and medium can be made up at a low cost and also can perform detection of a leak in a high reliability, without being affected at all by any condition inside the apparatus even when a leak occurs in the apparatus during the formation of deposited films.

To achieve the above object, the present invention provides a deposited-film formation apparatus comprising an inside-evacuatable chamber, a gas feed piping for feeding a material gas into the chamber, an evacuation means for evacuating the inside of the chamber, a first evacuation piping which connects the chamber and the evacuation means, and a second evacuation piping for guiding evacuation through the evacuation means, wherein, the deposited-film formation apparatus has a temperature sensor which detects the heat of reaction that is generated when the material gas fed into the chamber reacts with oxygen contained in air having entered from the outside of the deposited-film formation apparatus.

The present invention also provides a deposited-film formation process comprising the steps of evacuating the inside of an inside-evacuatable chamber through an evacuation piping by an evacuation means, feeding a material gas into the chamber while evacuating the inside of the chamber, and applying a high-frequency power to form a deposited film on a substrate disposed inside the chamber, wherein, a leak is detected on the basis of a measured value of a temperature sensor which detects the heat of reaction that is generated when the material gas fed into the chamber reacts with oxygen contained in air having entered from the outside, so as to be able to stop the material gas feeding.

The present invention still also provides a deposited-film formation apparatus comprising a chamber, a gas feed piping for feeding a reactive material gas into the chamber, and an evacuation means and an evacuation piping by and through which the inside of the chamber is evacuated, wherein, the deposited-film formation apparatus has at least one temperature sensor and a leak judgment means which judges the occurrence of a leak on the basis of a measured value of the temperature sensor.

The present invention further provides a vacuum system comprising a chamber, a gas feed means for feeding a gas into the chamber, and an evacuation means and an evacuation piping by and through which the inside of the chamber is evacuated, wherein, the vacuum system has a temperature sensor which detects the heat of reaction that is generated when the material gas fed into the chamber reacts with oxygen contained in air having entered from the outside of the deposited-film formation apparatus.

The present invention still further provides a leak judgment method comprising the steps of feeding a reactive gas to the inside of a vacuum system having a chamber and an evacuation piping, measuring temperature of the vacuum system at a plurality of spots thereof, and judging the occurrence of a leak on the basis of a change with time of a plurality of measured values obtained by measuring the temperature.

The present invention still further provides a computer-readable recording medium having a recorded program which is able to execute judgment on the occurrence of a leak of a vacuum system having a chamber into which a reactive gas is to be fed and having an evacuation piping, wherein, the recorded program is a program for executing the step of totaling a plurality of measured values obtained by measuring temperature of the vacuum system at a plurality of spots thereof, and the step of judging the occurrence of a leak on the basis of a change with time of the plurality of measured values.

In the present invention described above, the temperature sensor may preferably be provided on an outer wall surface of the chamber or at the evacuation piping. The temperature sensor may preferably be provided on the side downstream to the evacuation means. The first evacuation piping or the second evacuation piping has a piping connection part, and the temperature sensor may preferably be provided on the side downstream to the piping connection part. The deposited-film formation apparatus may preferably have a plurality of chambers and a means for moving a beltlike member continuously through the inside of the plurality of chambers in its lengthwise direction.

In the present invention, the leak may preferably be judged to have occurred when the plurality of measured values increase. The temperature of the vacuum system may preferably be measured at a plurality of spots thereof along the flow of gas in the vacuum system, and the leak may preferably be judged to have occurred when the plurality of measured values obtained by measuring the temperature increase along the flow of gas. An average value of the temperature of the evacuation piping may be found to regard it as a reference value, and the occurrence of a leak of the vacuum system may preferably be judged on the basis of a change with time with respect to the reference value of the plurality of measured values. A value greater than the reference value may be set as a warning value in advance, and the leak may preferably be judged to have occurred when the plurality of measured values become greater than the warning value.

A temperature detection means is employed as a means for detecting the entrance (inclusion) of air into the chamber or evacuation piping from the outside. Hence, the leak can be detected in a high precision in the deposited-film formation apparatus or deposited-film formation process making use of such reactive material gases having a spontaneous ignitability.

The leak can also quickly be detected, and hence the apparatus or system can promptly be brought into a safe state. For example, in case of the entrance (inclusion) of air into the chamber because of any unexpected accident such as a break of piping, the leak can quickly be detected. This enables safe and stable formation of deposited films in a large quantity.

BRIEF DESCRIPTION OF THE DRAWINGS

FIG. 7 illustrates an example of the construction of a roll-to-roll type deposited-film formation apparatus of Example 4.

DESCRIPTION OF THE PREFERRED EMBODIMENTS

Figure 1A:
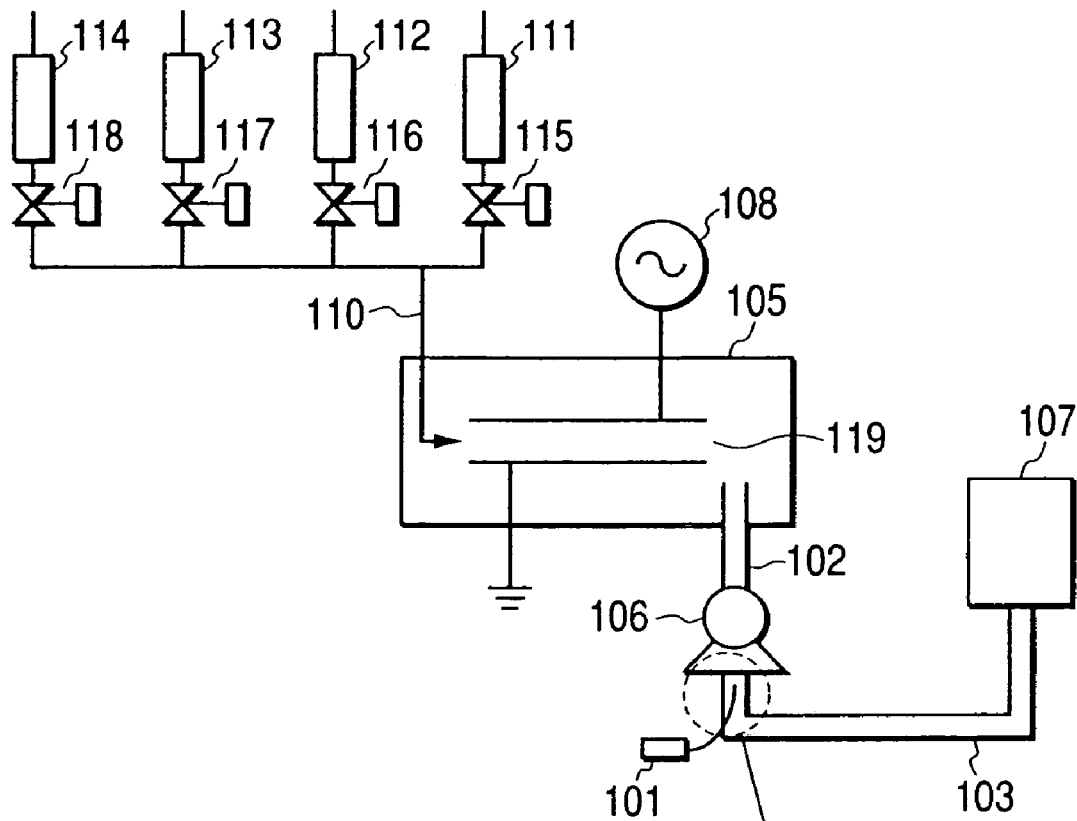
FIGS. 1A and 1B illustrate an example of the construction of a deposited-film formation apparatus according to an embodiment and Example 1 of the present invention.

To solve the problems discussed previously, the present inventors made various studies on methods by which any leak can be detected even in course of the formation of deposited films.

First, they took note of oxygen, one of atmospheric components, and made studies on how to detect oxygen.

Stated specifically, they made studies on the following three methods.

(1) A method of detecting the inclusion-of oxygen by means of an oxygen sensor.
(2) A method of detecting the inclusion of oxygen by means of a mass spectrometer.
(3) A method of detecting the heat of reaction of oxygen with gas by means of a temperature sensor.

As a result, it has become clear that the methods (1) and (2) are difficult to use in view of durability, cost, reliability, safety and so forth.

In the method (1), the oxygen sensor has a good detection sensitivity to oxygen at about atmospheric pressure, but shows a greatly low sensitivity in a high vacuum.

In the method (2), the mass spectrometer itself is expensive. Also, it has a high detection sensitivity in a high vacuum, but has a difficulty in detection itself at about atmospheric pressure, showing little sensitivity.

In addition, in any of the methods (1) and (2), upon contact with a reactive gas such as monosilane or an acid gas the sensor itself may so greatly deteriorate as to cause trouble soon. Also, any contamination due to dust or the like may cause a lowering of its sensitivity or trouble of the sensor itself.

From the foregoing, it is concluded to be difficult for the methods (1) and (2) to detect oxygen in a condition where reactive gases such as spontaneously ignitable gases are used. Also, the methods (1) and (2) are not preferable from the viewpoint of durability and cost of machinery, leak detection sensitivity, reliability and long-term stability.

On the other hand, the method (3), in which a temperature sensor is used, is preferred in view of the following point: Temperature can be measured from the outside, too. Hence, when the temperature sensor is provided outside the apparatus, the temperature can be measured without being affected at all by any internal condition of the apparatus.

Also when the temperature is measured with the temperature sensor inside the apparatus, the pressure of a vacuum chamber may little affect measurement precision. Also, the measurement is little affected by the reactive gas such as monosilane or the acid gas and also by contamination due to dust or the like. Still also, there is an advantage of a relatively low cost.

Actually, air in a quantity that may adversely affect electrical characteristics was brought in the chamber in course of the formation of deposited films to try inspecting whether or not the inclusion of air was detectable with a temperature sensor provided on an evacuation pipe connected to the chamber. As a result, it was found that the temperature sensor was well usable as a detection means.

Based on these results, further detailed studies were made on the method (3) of detecting temperature rise by means of a temperature sensor. As a result, it was ascertained that the method proved to be inexpensive and also have a high reliability.

It is more effective for the temperature sensor to be provided on evacuation piping (piping through which the gas sent away from a vacuum pump is flowed) positioned downstream to a vacuum pump, than to be provided on piping positioned between the chamber and the vacuum pump. In conventional apparatus, what is done on the evacuation piping positioned downstream to the vacuum pump is only to detect a leak by the pressure method after the deposited-film formation apparatus is stopped operating. In this evacuation piping, however, highly reactive material gases such as silane and a fluorine gas are present, and also commonly the piping is greatly contaminated with oil mist and dust of by-products. Moreover, the piping is kept at a negative pressure by an exhaust gas treatment apparatus (a harm eliminator), but the inside of the piping is kept at a pressure of approximately from 50 to 80 kPa, which is close to atmospheric pressure. Accordingly, the detection of a leak by means of a temperature sensor that employs the above method (3) is particularly effective for the piping extending between the vacuum pump and the exhaust gas treatment apparatus.

Thus, the method (3) may be employed, i.e., the temperature sensor may be provided at the inside-evacuatable or vacuum-keepable chamber and the piping through which material gases are fed, at the pump and piping for evacuating the inside of the chamber, or at the chamber or the piping. This enables quick detection of a leak by monitoring temperature by means of the temperature sensor while the spontaneously ignitable material gases are kept used. Hence, the use of material gases and formation of deposited films can be stopped immediately after the leak has been detected. Accordingly, any lowering of characteristics of deposited films can be kept minimum and also any fire, explosion or exposure to gas leakage can be prevented. Also, the functional deposited films can be formed in a large quantity, safely and stably.

An embodiment of the present invention is described below in detail with reference to FIGS. 1A and 1B.

Figure 1B:
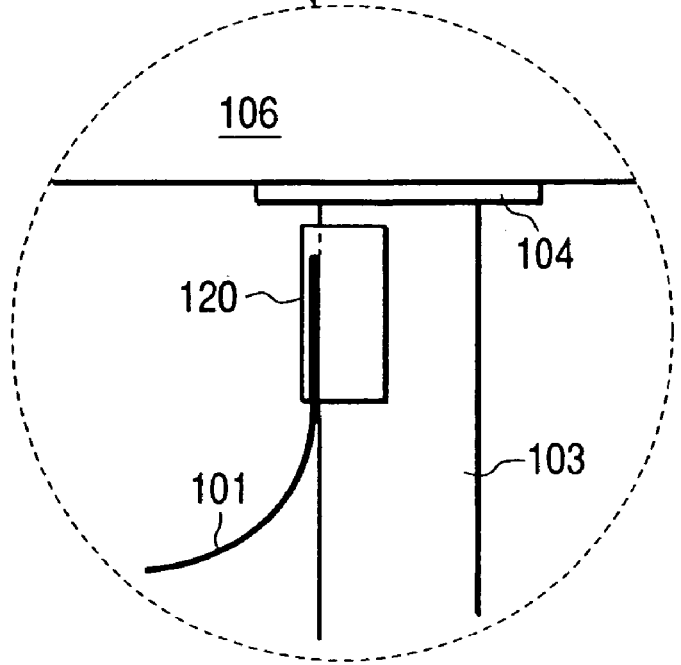

FIGS. 1A and 1B illustrate an example of the construction of a deposited-film formation apparatus according to the present invention. In FIGS. 1A and 1B, reference numeral 101 denotes a temperature sensor; 102, first evacuation piping; 103, downstream-side second evacuation piping; 104, a flange joint as a piping connection part; 105, deposited-film-forming chamber; 106, a vacuum pump as the evacuation means; 107, an exhaust gas treatment apparatus; 108, a high-frequency power source; 110, a gas introducing pipe; 111 to 114, gas flow meters; 115 to 118, valves; 119, electrodes; and 120, an aluminum tape. A thermocouple is used as the temperature sensor 101. The temperature sensor 101 is attached to the outer surface of the piping 103 in good contact so that the temperature of the evacuation piping 103 extending from the vacuum pump 106 to the exhaust gas treatment apparatus can be measured.

Deposited films are formed by means of this apparatus in the procedure as described below.

First, the vacuum pump 106 is actuated to evacuate the inside of the chamber 105 to well remove any atmospheric components such as oxygen present in the chamber 105.

Next, the valve 115 is opened to introduce into the chamber a dilute gas having been controlled at a desired flow rate through the gas flow meter 111.

Then, the valves 116 and 117 are opened in the like procedure to introduce thereinto a material gas or gases and a doping gas. After the gas flow rates have become stable, a desired high-frequency power which can well decompose the material gas or gases is applied by the high-frequency power source 108 to cause plasma (not shown) to form a deposited film on a substrate (not shown). Here, any gas not decomposed by the high-frequency power is drawn out, as it is, to the vacuum pump 106 through the evacuation piping 102. Then, the gas is compressed and drawn out through the vacuum pump 106, which is thereafter led to the exhaust gas treatment apparatus 107. In the exhaust gas treatment apparatus 107, the gas is turned harmless and changed in quality into a stable state, which is then brought to disposal in a safe state. Thus, after the deposited film has come to have a desired film thickness, the high-frequency power source 108 is turned off to stop the formation of deposited film.

Where a deposited film having a different quality is superposingly formed, valves 115 to 118 are opened or closed in the same procedure as the above to introduce into the chamber a gas or gases suited for the next deposited film, and a desired high-frequency power is again applied to form the deposited film.

Where deposited films are further superposingly formed, the same procedure as the above may be repeated to form deposited films successively. Thereafter, the inside of the chamber 105 is well displaced with a purging gas (not shown), and then the vacuum pump 106 is stopped. On the substrate having the deposited films thus formed, for example a transparent conductive film is formed in the next step.

The deposited films are formed in the above procedure.

The material gases used to form the deposited films may contain at least one kind of gas reactive with atmosphere, such as spontaneously ignitable gas. Monosilane ($SiH_4$) and disilane ($Si_2H_6$) are chief materials used when silicon films are formed, and are flowed at a high rate in the formation of deposited films and highly reactive with oxygen. Hence, monosilane ($SiH_4$) and disilane ($Si_2H_6$) are particularly preferred when the leak is detected using the temperature sensor.

For example, where silicon films such as amorphous silicon films and microcrystalline silicon films are formed, monosilane ($SiH_4$), disilane ($Si_2H_6$) or the like is used as the material gas. To such gas, an element containing nitrogen atoms, such as nitrogen ($N_2$) and ammonia ($NH_3$), oxygen ($O_2$), carbon monoxide (CO), carbon dioxide ($CO_2$), methane ($CH_4$), monogermane ($GeH_4$) or the like may also be added in order to change band gap width. A dopant gas such as diborane ($B_2H_6$), boron trifluoride ($BF_3$) or phosphine ($PH_3$) may also simultaneously be introduced into the chamber for the purpose of doping.

Also when silicon tetrafluoride ($SiF_4$), disilicon hexafluoride ($Si_2F_6$) or the like, which is not spontaneously ignitable, is used as the material gas, a gas reactive with atmosphere (spontaneously ignitable gas) such as monogermane ($GeH_4$) or phosphine ($PH_3$) may be used as the dopant gas.

As the temperature sensor, a device which can effectively measure temperature of about room temperature is preferred. Also, a device which can well precisely measure temperature of about 0 to 150° C. as exemplified by a thermocouple or a platinum resistance thermometer is more preferred. Depending on the part where the temperature is measured, a radiation type thermometer may also be used.

Where the thermocouple and a commonly available temperature indicator are used in combination, the temperature indicator shows an abrupt rise in temperature upon any disconnection of the thermocouple, and hence there is a possibility that this is mistaken for the temperature rise due to a leak. Accordingly, in the case where the thermocouple and a commonly available temperature indicator are used in combination, any abrupt change in temperature within 10 to 30 seconds from the beginning of temperature rise may preferably be judged to be the disconnection of the thermocouple.

A plurality of thermocouples may also preferably be provided at one monitoring spot so that any temperature rise detected by a plurality of or all of thermocouples may be judged to be a leak. Also, a temperature rise detected by a plurality of thermocouples provided continuously in the direction of gas flow may also be judged to be a leak.

These leaks may also be judged by software processing using a computer. For example, the occurrence of a leak may be judged using a program which can execute judgment of leaks or a computer-readable recording medium in which such a program has been recorded.

Thus, the deposited-film formation apparatus or vacuum system may also have the above computer as a leak judgment means which judges the occurrence of a leak on the basis of a measured value of the temperature sensor. It may also have a feed-gas feed control means which stops the feeding of material gases upon detection of a leak by the leak judgment means.

The occurrence of a leak may be judged, when done in a room, at 20° C. to 50° C. with respect to room temperature so as to prevent any miss-operation from being caused by any external disorder and also to ensure a good detection sensitivity.

The temperature sensor may further be attached in the interior of piping. Such a case is effective for preventing miss-operation and improving detection sensitivity.

The temperature sensor, or the temperature sensor and the piping, may also be lagged with a heat insulator or the like so that the leak detection sensitivity does not lower even when part of the piping is provided outdoors and surrounding temperature may change greatly because of sunlight, wind and rain, atmospheric temperature and so forth.

The temperature may also be monitored some frequently- or always so that an average value of piping temperature can be found, and this value may be used as a reference value so that any variation from the reference value may be monitored. This brings about an improvement in detection precision. Also, a certain value of variation from a preset reference value may be set as a warning value so that any temperature changes due to seasonal variations can be taken into account. This brings about a more improvement in detection precision.

The leak also tends to occur at piping connection flanges or at piping welded joints. Also, around the vacuum pump, the leak tends to occur because of any break of piping due to vibration or the like of the vacuum pump and because of any deterioration of O-rings due to oil mist. The temperature sensor may preferably be provided on the side downstream to such portions tending to cause a leak, bringing about an improvement in detection sensitivity. It may preferably be provided at a position about 5 to 20 cm downstream to the portion tending to cause a leak.

Examples and Comparative Example of the present invention are given below. The present invention is by no means limited by these.

EXAMPLE 1

FIGS. 1A and 1B show an example of the deposited-film formation apparatus (vacuum system) (described previously) of the present invention. In Example 1, in the apparatus shown in FIGS. 1A and 1B, usable for mass production of amorphous silicon solar cells of n-i-p layer construction, a thermocouple 101 was fixed as the temperature sensor 101 to the outer wall of a pipe attached directly to the vacuum pump 106 of the evacuation piping 103 extending between the vacuum pump 106 and the exhaust gas treatment apparatus 107. The temperature sensor (thermocouple) 101 was further covered with an aluminum tape 120 in order to more improve thermal contact. At the time of formation of an n-type layer, fed were 250 ml/min·normal of monosilane (SiH$_4$), 3,000 ml/min·normal of hydrogen (H$_2$) and 20 ml/min·normal of phosphine (PH$_3$); at the time of formation of an i-type layer, 100 ml/min·normal of monosilane and 1,000 ml/min·normal of hydrogen; and at the time of formation of a p-type layer, 50 ml/min·normal of monosilane, 4,000 ml/min·normal of hydrogen and 2 ml/min·normal of boron trifluoride (BF$_3$).

Figure 2:
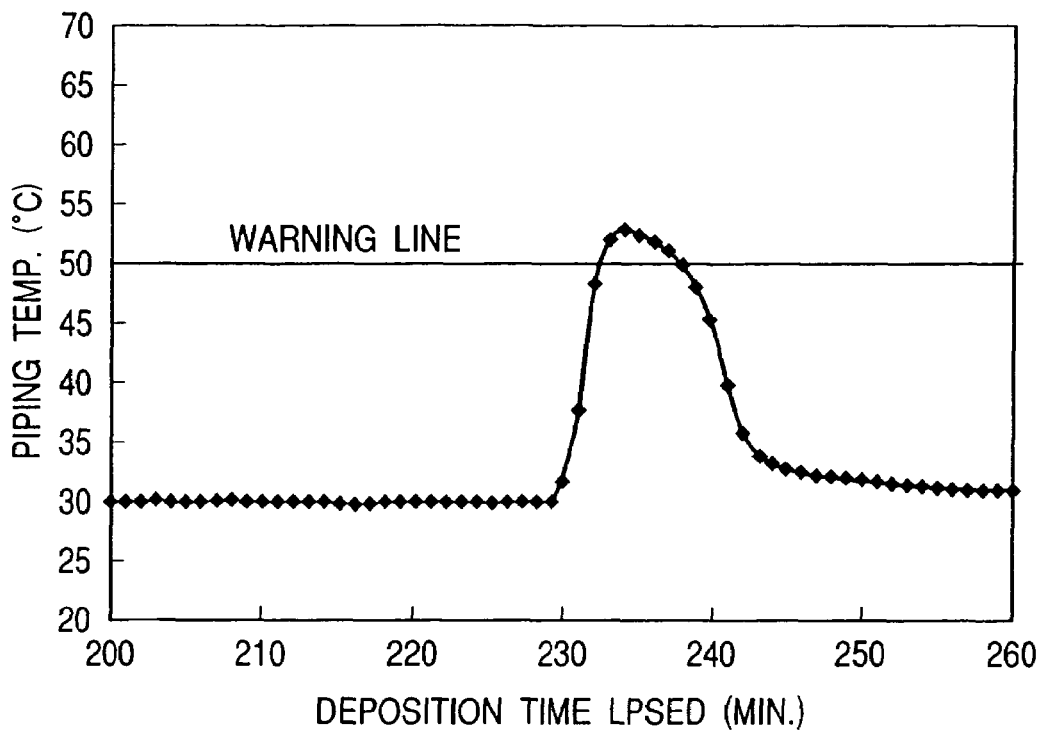
FIG. 2 is a graph showing the relationship between piping temperature and deposition time lapsed, in Example 1.

In Example 1, amorphous silicon films were deposited on stainless steel substrates (not shown) in the manner as in the above embodiment, monitoring temperature indication of a temperature indicator (not shown) connected to the thermocouple 101. In this way the deposited-film formation apparatus was continuously operated on and on, whereupon, in a certain batch, the temperature the thermocouple 101 kept to measure which was attached to the piping 103 extending between the vacuum pump 106 and the exhaust gas treatment apparatus 107 rose to 50° C. from 30° C. as shown in FIG. 2, in course of the formation of deposited films. Incidentally, FIG. 2 shows a change with deposition time lapsed, in the temperature the temperature sensor 101 indicates.

Accordingly, the formation of deposited films was immediately stopped to check the piping 103. A leak was found to have occurred because of a crack caused by vibration of the vacuum pump 106 at the welded joint of the piping 103.

The interior of the piping 103 was such that a by-product silicon oxide stood adhered only to the leaked portion and its vicinity, and hence it was immediately removable. Accordingly, the piping 103 having caused the leak was promptly exchanged. Also, all samples (deposited-film-formed substrates) were evaluated to find that samples on which deposited films were formed while the leak occurred showed faulty characteristics because of imperfect formation of deposited films, but samples obtained before the leak occurred did not show any lowering of characteristics.

COMPARATIVE EXAMPLE

Figure 3:
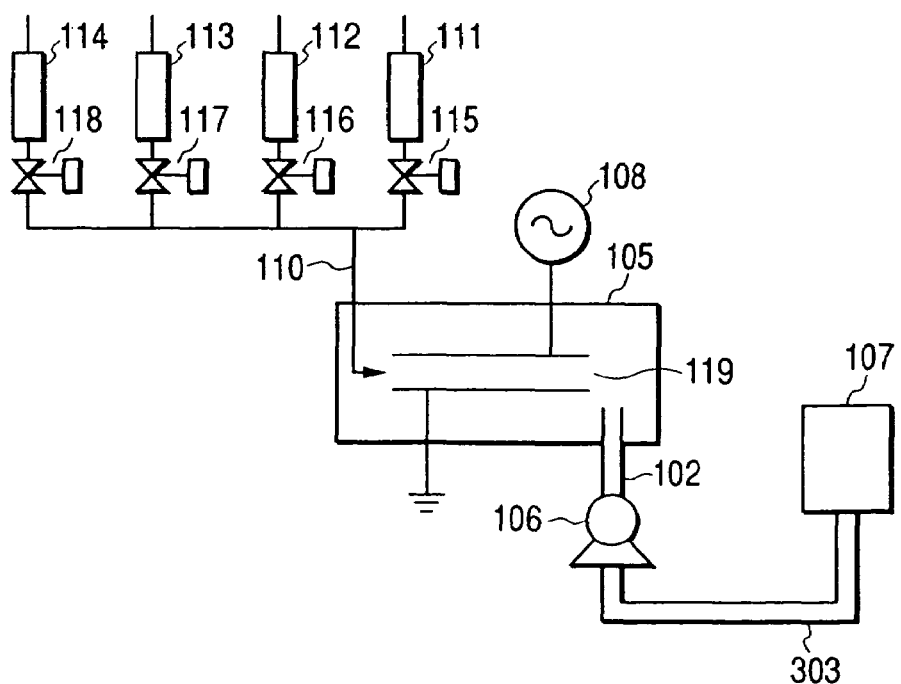
FIG. 3 illustrates an example of the construction commonly employed in a deposited-film formation apparatus.

FIG. 3 shows an example of a conventional deposited-film formation apparatus (vacuum system). In FIG. 3, the same members or components as those in FIGS. 1A and 1B are denoted by like reference numerals. Reference numeral 303 denotes evacuation piping.

In this Comparative Example, in the apparatus shown in FIG. 3, usable for mass production of amorphous silicon solar cells of n-i-p layer construction, any temperature sensor 101 was not provided. At the time of formation of an n-type layer, fed were 250 ml/min·normal of monosilane (SiH$_4$), 3,000 ml/min·normal of hydrogen (H$_2$) and 20 ml/min·normal of phosphine (PH$_3$); at the time of formation of an i-type layer, 100 ml/min·normal of monosilane and 1,000 ml/min·normal of hydrogen; and at the time of formation of a p-type layer, 50 ml/min·normal of monosilane, 4,000 ml/min·normal of hydrogen and 2 ml/min·normal of boron trifluoride (BF$_3$).

Comparative Example differs from Example 1 in that the piping temperature during the formation of deposited films was not monitored. Amorphous silicon films were deposited on stainless steel substrates in the manner as in the above embodiment. Deposited films formed by continuously operating the apparatus in this manner were evaluated as solar cells for each batch.

Figure 4:
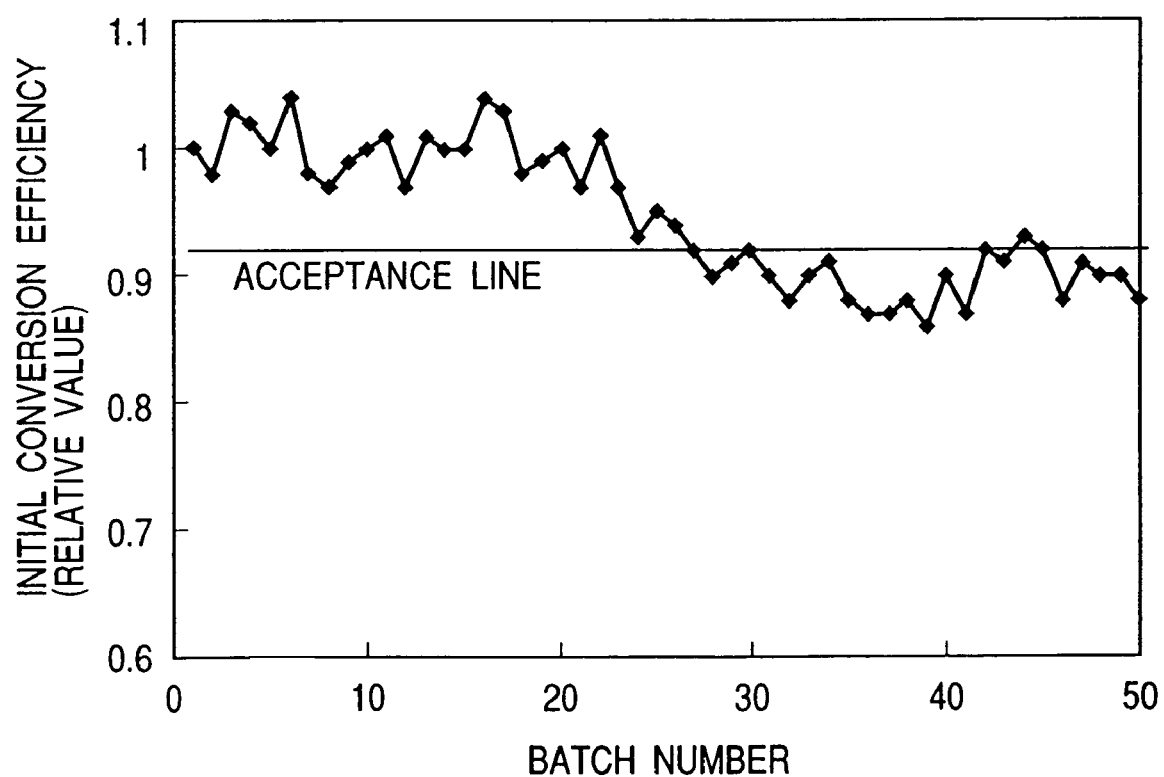
FIG. 4 is a graph showing the relationship between solar-cell initial conversion efficiency and batch number in a case where the deposition of films are repeated by a process of a comparative example, using the deposited-film formation apparatus shown in FIG. 3.

FIG. 4 shows the relationship between batch number and initial conversion efficiency (relative value). As shown in FIG. 4, the conversion efficiency begins to lower at about batch number 23, and the lowering of characteristics is remarkable at about batch number 27 and the subsequent batches, where about 50% of the whole is seen to have low characteristics, resulting in defectives.

For the investigation of the cause, the apparatus was stopped to make examination therefor. As a result of examination, a leak was found to have occurred at piping 303 connecting the vacuum pump 106 and the exhaust gas treatment apparatus 107 of the apparatus shown in FIG. 3.

In the interior of the piping 303, silicon oxide which was a by-product of monosilane and oxygen had deposited and the silicon oxide had clogged the piping 303 by about 70% of its cross-sectional area. It took three days to remove this deposit. Also, with regard to unremovable portions, parts were replaced.

EXAMPLE 2

Figure 5A:
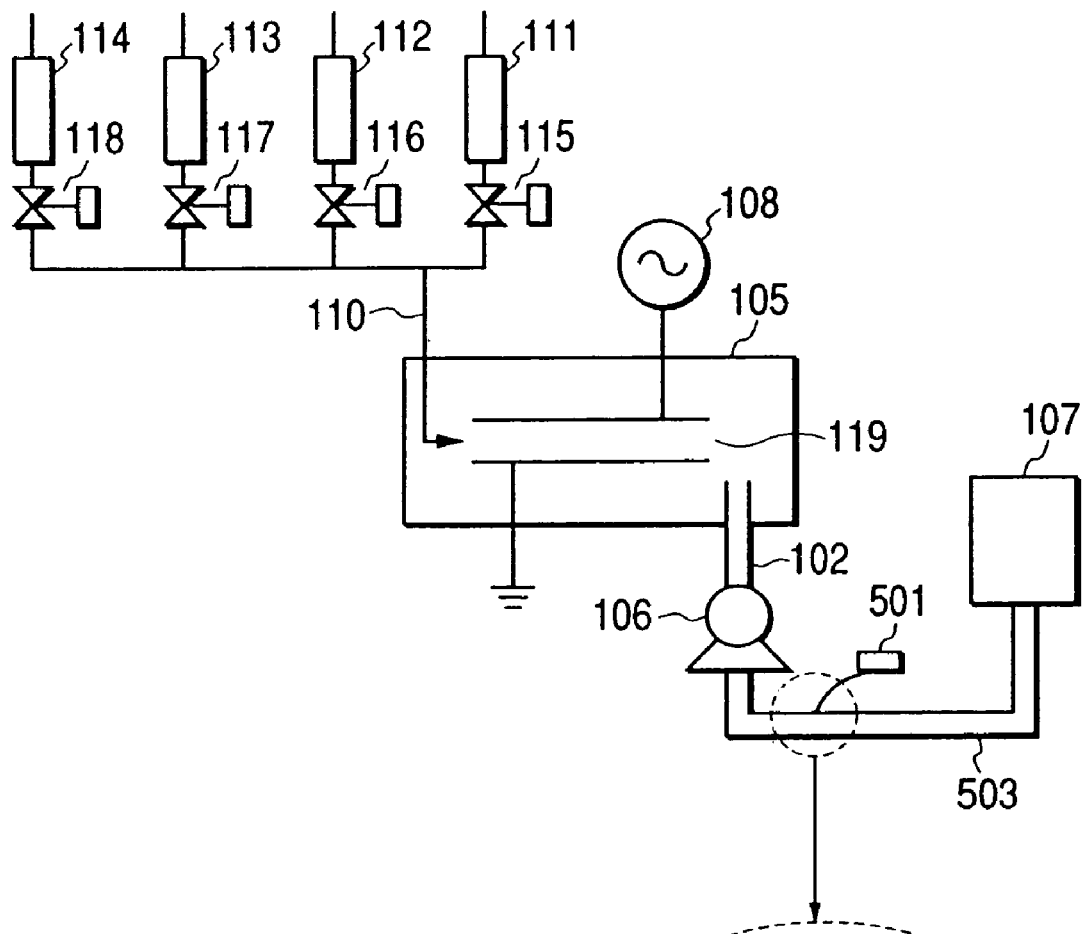
FIGS. 5A and 5B illustrate an example of the construction of a deposited-film formation apparatus of Example 2.
Figure 5B:
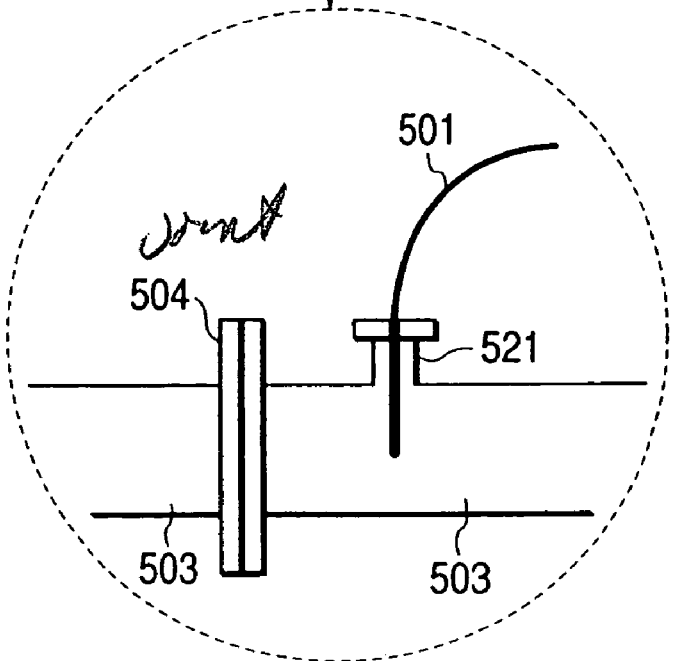

FIGS. 5A and 5B show another example of the construction of a deposited-film formation apparatus. In FIGS. 5A and 5B, the same members or components as those in FIGS. 1A and 1B are denoted by like reference numerals. Reference numeral 501 denotes a thermocouple; 503, evacuation piping; 504, a flange joint; and 521, a threaded joint.

In Example 2, the thermocouple 501 was fixed to evacuation piping 503 extending between the vacuum pump 106 and the exhaust gas treatment apparatus 107, at its position on 15 cm downstream side of the flange joint 504 of the piping and via the threaded joint 521. At the time of formation of an n-type layer, fed were 250 ml/min·normal of monosilane (SiH$_4$), 3,000 ml/min·normal of hydrogen (H$_2$) and 20 ml/min·normal of phosphine (PH$_3$); at the time of formation of an i-type layer, 100 ml/min·normal of monosilane and 1,000 ml/min·normal of hydrogen; and at the time of formation of a p-type layer, 50 ml/min·normal of monosilane, 4,000 ml/min·normal of hydrogen and 2 ml/min·normal of boron trifluoride (BF$_3$).

In Example 2, amorphous silicon films were deposited on stainless steel substrates (not shown) in the manner as in the above embodiment, monitoring temperature indication of a temperature indicator (not shown) connected to the thermocouple 501. In this way the deposited-film formation apparatus was continuously operated on and on, whereupon the temperature the thermocouple 501 kept to measure which was attached to the piping 503 extending between the vacuum pump 106 and the exhaust gas treatment apparatus 107 rose to 93° C. from 31° C. in course of the formation of deposited films. The formation of deposited films was immediately stopped to check the piping 503. As a result, a packing made of silicone rubber (not shown), inserted to the flange joint 504 of the piping, was found to have been corroded by an acid solution having stagnated in the piping 503, and a leak had occurred at the corroded portion.

The interior of the piping 503 was such that a by-product silicon oxide stood adhered only to the leaked portion and its vicinity, and hence it was immediately removable. The packing was also promptly exchanged. Also, all samples were evaluated to find that samples on which deposited films were formed while the leak occurred showed faulty characteristics because of imperfect formation of deposited films, but samples obtained before the leak occurred did not show any lowering of characteristics.

EXAMPLE 3

Figure 6A:
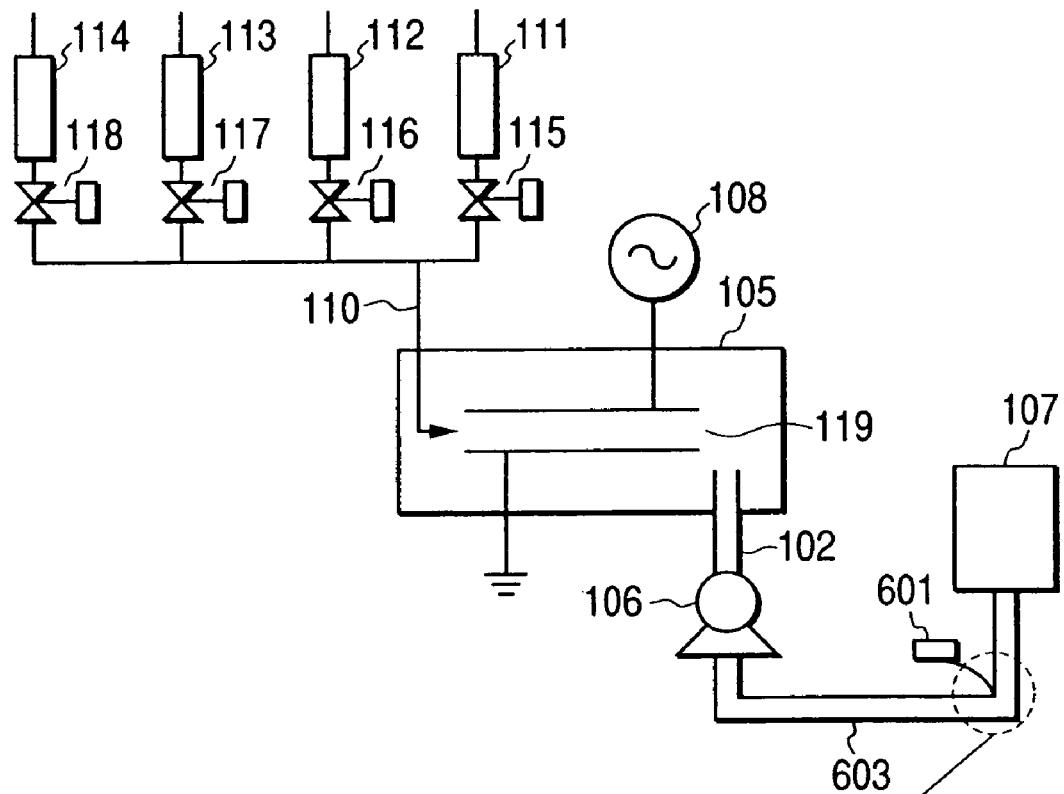
FIGS. 6A and 6B illustrate an example of the construction of a deposited-film formation apparatus of Example 3.
Figure 6B:
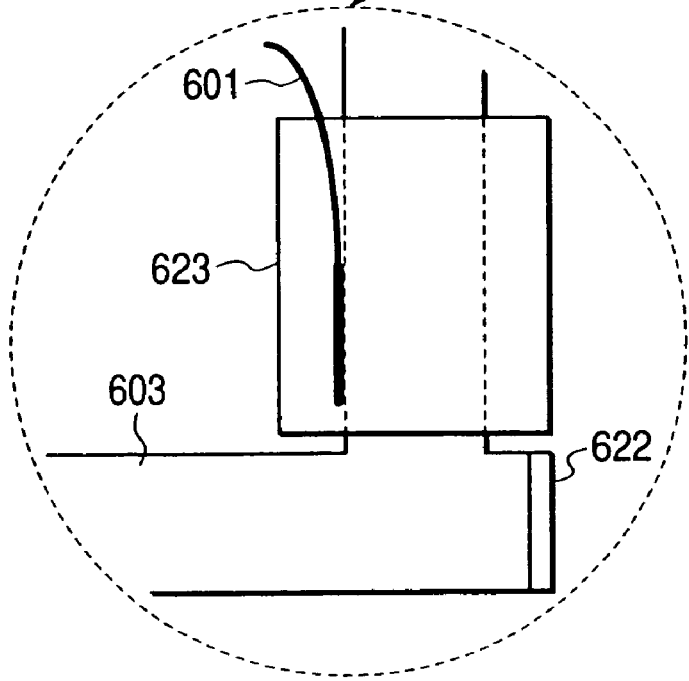

In Example 3 a deposited-film formation apparatus shown in FIGS. 6A and 6B was used. In FIGS. 6A and 6B, the same members or components as those in FIGS. 1A and 1B are denoted by like reference numerals. Reference numeral 601 denotes a thermocouple; 603, evacuation piping; 622, a sight glass window; and 623, a heat insulator.

In the apparatus shown in FIGS. 6A and 6B, the main part of the apparatus and the exhaust gas treatment apparatus 107 are provided at a large distance, and part of the evacuation piping 603; extending between the vacuum pump 106 and the exhaust gas treatment apparatus 107, is installed outdoors. This evacuation piping 603 is provided at its part exposed to the outdoor, with the sight glass window 622 as another kind of piping connection part so that its interior can be observed. The thermocouple 601 is provided at a position on 10 cm downstream side of the sight glass window 622. Also, the thermocouple 601 and its surrounding piping are kept covered with the heat insulator 623.

Using this apparatus, at the time of formation of an n-type layer, fed were 250 ml/min·normal of monosilane ($SiH_4$), 3,000 ml/min·normal of hydrogen ($H_2$) and 20 ml/min·normal of phosphine ($PH_3$); at the time of formation of an i-type layer, 100 ml/min·normal of monosilane and 1,000 ml/min·normal of hydrogen; and at the time of formation of a p-type layer, 50 ml/min·normal of monosilane, 4,000 ml/min·normal of hydrogen and 2 ml/min·normal of boron trifluoride ($BF_3$).

In Example 3, amorphous silicon films were deposited on stainless steel substrates (not shown) in the manner as in the above embodiment, monitoring temperature indication of a temperature indicator (not shown) connected to the thermocouple 601. In this way the deposited-film formation apparatus was continuously operated on and on, whereupon, in a certain batch, the temperature the thermocouple 601 kept to measure which was attached to the piping 603 extending between the vacuum pump 106 and the exhaust gas treatment apparatus 107 rose to 24° C. from 10° C. in course of the formation of deposited films.

Accordingly, the formation of deposited films was immediately stopped to check the piping 603. A leak was found to have occurred because of a crack caused in the sight glass window 622 by any external factor.

The interior of the piping 603 was such that a by-product silicon oxide stood adhered only to the leaked portion and its vicinity, and hence it was immediately removable. Also, all samples were evaluated to find that samples on which deposited films were formed while the leak occurred showed faulty characteristics because of imperfect formation of deposited films, but samples obtained before the leak occurred did not show any lowering of characteristics.

EXAMPLE 4

FIG. 7 shows an example of a roll-to-roll type deposited-film formation apparatus (vacuum system) of the present invention. In Example 4, the apparatus shown in FIG. 7, usable for mass production of solar cells, was used to continuously form amorphous silicon solar cells of n-i-p/n-i-p/n-i-p triple layer construction.

In FIG. 7, reference numerals 701 to 709 denote thermocouples as temperature sensors; 711 to 719, evacuation piping; 720, main evacuation piping; 721 to 729, flexible tubes made of stainless steel; 730, a beltlike-substrate wind-off chamber; 741, slit-type passages; 731 to 739, deposited-film-forming chambers; 740, a beltlike-substrate wind-up chamber; 742, a beltlike-substrate; 751, vacuum pumps; and 752, an exhaust gas treatment apparatus. In this apparatus, the thermocouples 701 to 709 are each provided at the part where each of the evacuation piping 711 to 719 is connected to the main evacuation piping 720.

A deposited-film formation process is described with reference to FIG. 7. First, the insides of all the chambers 730 to 740 are brought to atmospheric pressure, and the insides of the chambers 730 to 740 are cleaned, where the beltlike substrate 742 wound in a roll is set in the substrate wind-off chamber 730. Then, the roll-type substrate 742 is set by passing it through a plurality of deposited-film-forming chambers 731 to 739 and the slit-type passages 741 up to the substrate wind-up chamber 740. Thereafter, the insides of all the chambers 730 to 740 are evacuated by means of the vacuum pumps 751.

In the deposited-film-forming chambers 731 to 739, the chambers 731 to 739 were heated by means of heaters (not shown) to effect baking sufficiently. Thereafter, at the time of formation of n-type layers, fed from material gas feed piping were 250 ml/min·normal of monosilane ($SiH_4$), 3,000 ml/min·normal of hydrogen ($H_2$) and 20 ml/min·normal of phosphine ($PH_3$); at the time of formation of i-type layers, 100 ml/min·normal of monosilane and 1,000 ml/min·normal of hydrogen; and at the time of formation of p-type layers, 50 ml/min·normal of monosilane, 4,000 ml/min·normal of hydrogen and 2 ml/min·normal of boron trifluoride ($BF_3$).

The material gases were thus fed and high-frequency power suited for the deposited-film-forming chambers 731 to 739 was supplied to form amorphous silicon solar cells of the triple layer construction, on the beltlike substrate 742 moving at a constant speed.

In course of the formation of deposited films, the temperature measured with the thermocouple 705 rose to 78° C. from 26° C. One minute later, the thermocouple 704 showed a temperature rise to 66° C. from 26° C., and further one minute later, the thermocouple 703 a temperature rise to 51° C. from 26° C. From this phenomenon, a leak was judged to have occurred at any of the flexible tube 725, the evacuation piping 715 and the main evacuation piping 720.

Accordingly, the supply of high-frequency power, the feeding of material gases and the heaters which were heating the respective chambers were stopped, and, being kept evacuated, an inert gas helium (He) was continued to be fed through the respective chambers 730 to 740 to cool the deposited-film-forming chambers 731 to 739. Thereafter, as a non-reactive purging gas, dry nitrogen was fed into the chambers 730 to 740 and the insides of the chambers 730 to 740 were returned to atmospheric pressure. After they were returned to atmospheric pressure, the substrate wind-up chamber 740 was opened to take out a film-deposited beltlike substrate halfway wound up in a roll. Then, the chambers 730 to 740 were again cleaned and a new beltlike substrate 742 wound in a roll was set in the substrate wind-off chamber 730 to continue film deposition under the like conditions.

On the film-deposited beltlike substrate (deposited-film-formed substrate) 742 wound up in a roll, transparent conductive films were further formed in subsequent steps to produce solar cells. Then, characteristics of the solar cells were evaluated.

Figure 8:
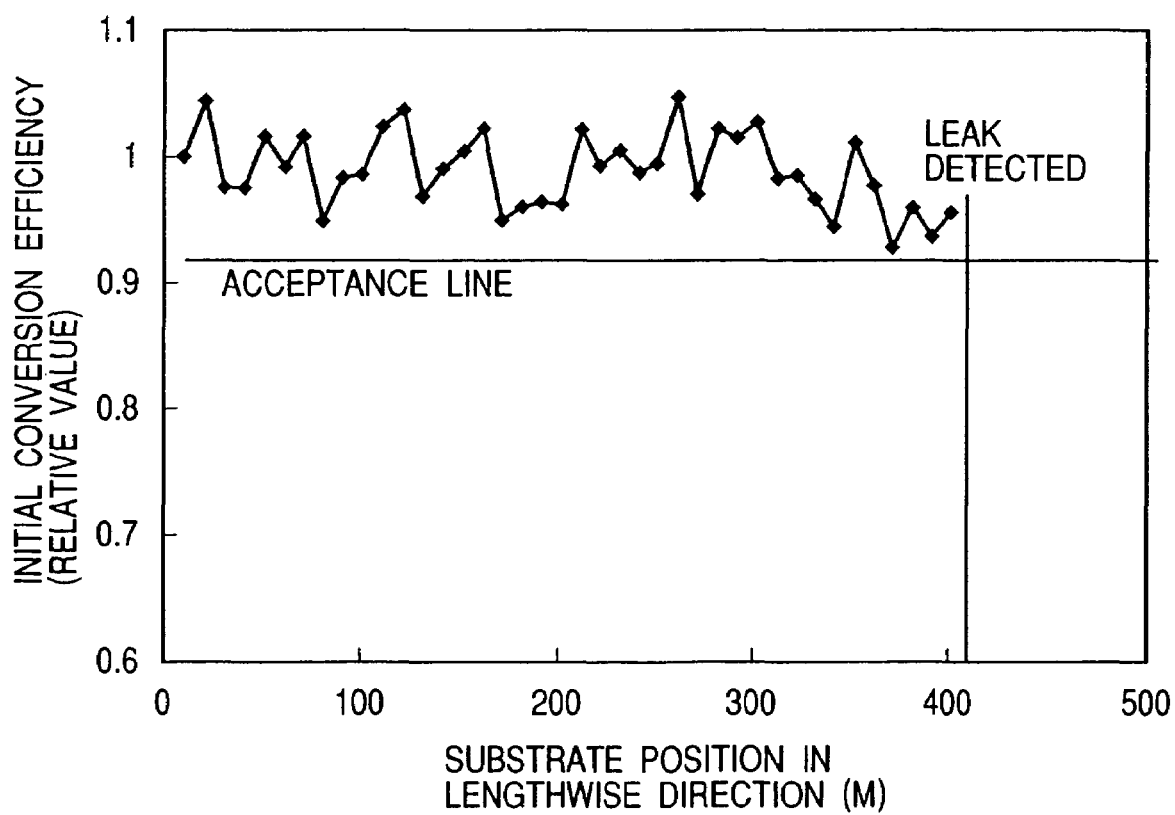
FIG. 8 is a graph showing the relationship between belt-like-substrate position in lengthwise direction and conversion efficiency in Example 4.

Evaluation was made on photoelectric conversion efficiency, and changes in conversion efficiency with respect to the lengthwise direction of the beltlike substrate for one roll were measured. FIG. 8 shows the relationship between belt-like-substrate position in lengthwise direction and conversion efficiency.

As shown in FIG. 8, no lowering of characteristics was seen in all samples wound up in the substrate wind-up chamber and on which all layers had been formed.

The flexible tube 725, the evacuation piping 715 and the main evacuation piping 720 which were considered to have caused a leak were checked to find that the leak has occurred at the stainless-steel flexible tube 725, provided on the evacuation piping 714 between the vacuum pump 751 and the main evacuation piping 720. The leak was presumed to be caused by an acid solution having stagnated in the flexible tube 725 and evacuation piping 715 and having corroded the stainless-steel flexible tube to make it brittle to cause a crack because of the vibration of the vacuum pump 751. The interior of the flexible tube 725 was such that a by-product silicon oxide stood adhered only to the leaked portion and its vicinity. Hence, the by-product was immediately removable and the tube was also promptly replaceable.

As described above, according to the present invention, the temperature sensor is provided on the chamber or at the evacuation piping, whereby any leak can be detected even when it occurs in the apparatus in course of the formation of deposited films.

Since also the leak is detected by the temperature sensor, the detection is not affected at all by any condition inside the apparatus. The apparatus can also be set up at a low cost. In addition, because of a high reliability of leak detection, the apparatus can promptly be brought into a safe state.

Thus, the present invention enables safe and stable formation of deposited films in a large quantity.

What is claimed is:

1. Method of detecting the occurrence of a leak due to the entry of external air to the interior of a chamber or piping comprising the steps of:

forming a deposited film from reactive gas in a deposited film-forming apparatus which includes a vacuum pump mounted in an evacuation piping and an exhaust gas treatment unit downstream of the vacuum pump;

measuring temperature in the evacuation piping at a plurality of spots thereof employing a plurality of temperature sensors;

measuring a plurality of temperature values from the temperature sensors; and detecting a leak of reactant gases based on a temperature change, detected by the temperature sensors, which is caused by reaction between oxygen entering the chamber or the piping and the reactive gas.

2. The method according to claim 1, wherein an average value of the temperature of the evacuation piping is found by averaging the output of detected temperatures of the temperature sensors.

3. The method according to claim 2, wherein a detected temperature value greater than the reference value, determined by the average value of piping temperatures, is preset as a warning value, and the leak is determined to be present when the plurality of measured temperature values become greater than the warning value.

4. The method according to claim 1, wherein the plurality of temperature sensors is provided in one measurement region, and the leak is determined when temperature increase is detected by at least two temperature sensors among the plurality of sensors provided in the one measurement region.

5. The method according to claim 1, wherein the plurality of temperature sensors is continuously provided in a direction of gas flow, and the leak is determined when temperature increase is detected by the plurality of temperature sensors continuously provided.

* * * * *